United States Patent
Butler et al.

(10) Patent No.: US 8,705,004 B2
(45) Date of Patent: Apr. 22, 2014

(54) LITHOGRAPHIC METHOD AND APPARATUS

(75) Inventors: Hans Butler, Best (NL); Remco Jochem Sebastiaan Groenendijk, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 317 days.

(21) Appl. No.: 12/897,355

(22) Filed: Oct. 4, 2010

(65) Prior Publication Data

US 2011/0102757 A1 May 5, 2011

Related U.S. Application Data

(60) Provisional application No. 61/256,613, filed on Oct. 30, 2009.

(51) Int. Cl.
*G03B 27/52* (2006.01)
*G03B 27/54* (2006.01)

(52) U.S. Cl.
USPC .............................................. 355/55; 355/67

(58) Field of Classification Search
USPC ............ 355/52, 53, 55, 67–69; 356/399–401; 250/548
See application file for complete search history.

(56) References Cited

U.S. PATENT DOCUMENTS

| | | | |
|---|---|---|---|
| 5,448,332 A | 9/1995 | Sakakibara et al. | |
| 5,526,093 A * | 6/1996 | Takahashi | 355/53 |
| 6,191,429 B1 * | 2/2001 | Suwa | 250/548 |
| 7,209,215 B2 * | 4/2007 | Akamatsu | 355/55 |
| 7,369,214 B2 | 5/2008 | Galburt | |
| 7,570,345 B2 * | 8/2009 | Reisinger et al. | 355/67 |
| 8,077,290 B2 | 12/2011 | Motojima | |
| 2009/0233195 A1 | 9/2009 | Miyashita | |
| 2010/0103393 A1 * | 4/2010 | Motojima | 355/53 |

FOREIGN PATENT DOCUMENTS

| | | |
|---|---|---|
| EP | 1 674 939 A1 | 6/2006 |
| JP | 01-112727 A | 5/1989 |
| JP | 04-052650 A | 2/1992 |
| JP | 06-260391 A | 9/1994 |
| JP | 2000-228344 A | 8/2000 |
| JP | 2004-259815 A | 9/2004 |
| JP | 2006-186287 A | 7/2006 |
| JP | 2006-269669 A | 10/2006 |

(Continued)

OTHER PUBLICATIONS

English-Language Abstract for Japanese Patent Publication No. 2004-259815 A, published Sep. 16, 2004; 1 page.

(Continued)

*Primary Examiner* — Hung Henry Nguyen
(74) *Attorney, Agent, or Firm* — Sterne, Kessler, Goldstein & Fox P.L.L.C.

(57) ABSTRACT

A method is disclosed. A change in position of a substrate in a direction substantially parallel to a direction of propagation of a radiation beam that is, or is to be, projected on to that substrate is determined, which change in position would result in a lithographic error in the application of a pattern to that substrate using that radiation beam. The change in position of the substrate is used to control a property of the radiation beam when, or as, the radiation beam is projected onto the substrate in order to reduce the lithographic error.

10 Claims, 3 Drawing Sheets

(56) References Cited

FOREIGN PATENT DOCUMENTS

Figure 1:
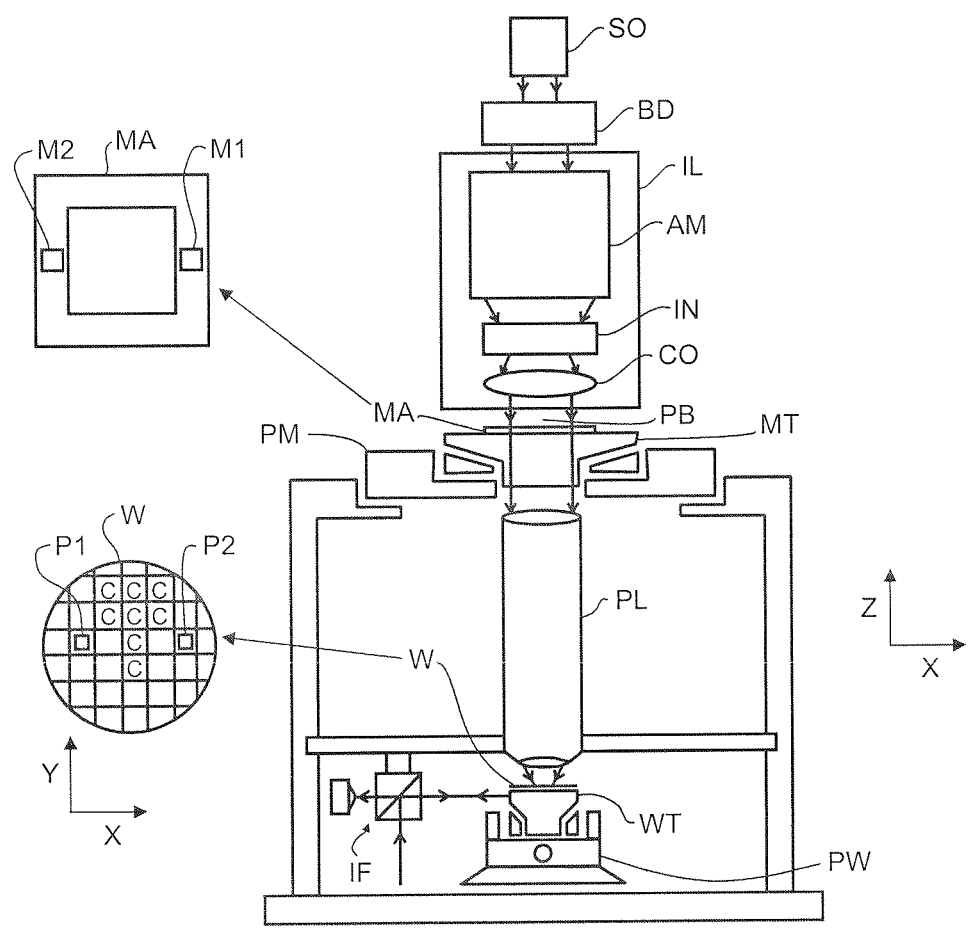

| JP | 2007-049165 A | 2/2007 |
| JP | 2008-016828 A | 1/2008 |
| WO | WO 2008/038751 A1 | 4/2008 |
| WO | WO 2009/060294 A2 | 5/2009 |

OTHER PUBLICATIONS

English-Language Abstract for Japanese Patent Publication No. 2006-269669 A, published Oct. 5, 2006; 1 page.

\* cited by examiner

LITHOGRAPHIC METHOD AND APPARATUS

CROSS REFERENCE TO RELATED APPLICATIONS

This application claims benefit under 35 U.S.C. §119(e) to U.S. Provisional Patent Application No. 61/256,613, filed Oct. 30, 2009, which is incorporated by reference herein in its entirety.

BACKGROUND

1. Field of the Invention

The present invention relates to a lithographic method and apparatus.

2. Background Art

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

Before exposing the substrate to radiation, it is known to obtain information related to the topography of the substrate. The topography of the substrate, or more particularly changes in that topography, may have an affect on the application of patterns to the substrate. For instance, changes in that topography may result in different parts of the substrate being closer to or further away from a projection system than a nominal distance, which could result in the radiation beam being slightly out of focus when it is incident on the substrate. This could affect the pattern features of a pattern applied to the substrate, for example a critical dimension of pattern features applied to the substrate.

Determining information related to the topography before an exposure is undertaken allows changes in topography to be taken into account (i.e., at least partially compensated for) during the exposure itself. For instance, as the exposure is taking place, exposure properties (i.e., properties of the radiation beam) may be controlled to take into account the changes in topography. One such exposure property may be, for example, a dose of radiation provided by the radiation beam. The dose may be controlled for different areas of the substrate relative to the topography of that particular area of the substrate.

Even if the topography of the substrate is known before exposure takes place, lithographic errors may still be present in the application of a pattern to the substrate during the exposure of the substrate. For example, scanning of the substrate during the exposure may result in an unintended movement of the substrate toward or away from the projection system of the lithographic apparatus (i.e., in a direction substantially parallel to a direction of propagation or projection of the radiation beam). Such movement might result in a radiation beam incident on the substrate not being in focus, or not having a desired angular intensity distribution, which may lead to a lithographic error in the application of a pattern to the substrate. A lithographic error may be an unintended increase or decrease in one or more dimensions of a pattern feature applied to the substrate, for example a change in width, height, side wall angle, or shape of a pattern feature applied to the substrate.

Even if the substrate is not scanned during exposure, the same or similar problems as described above may still exist. For example, during operation of a lithographic apparatus, movement of the substrate toward or away from the projection system, for whatever reason, may result in a lithographic error in a pattern applied to a substrate.

SUMMARY

It is desirable to provide, for example a lithographic method and/or apparatus that obviates or mitigates one or more of the problems, whether identified herein or elsewhere, or which provides an alternative to an existing lithographic method and/or apparatus.

According to a first aspect of the present invention, there is provided a lithographic method comprising the following operations. Determining a change in position of a substrate in a direction substantially parallel to a direction of propagation of a radiation beam that is, or is to be, projected on to that substrate, which change in position would result in a lithographic error in the application of a pattern to that substrate using that radiation beam. Using the change in position of the substrate to control a property of the radiation beam when, or as, the radiation beam is projected onto the substrate in order to reduce the lithographic error.

The change in position of the substrate may be determined as the substrate is scanned in a direction substantially orthogonal to the direction of propagation of the radiation beam.

The property of the radiation beam may be controlled as the substrate is scanned. The control of the property may be in response to, and thus track, the change in position.

The change in position of the substrate may be determined relative to a substantially fixed reference.

The change in position of the substrate may be determined relative to an element of a lithographic apparatus that is to be used to control a property of the radiation beam, and/or to project the radiation beam onto the substrate.

The property of the radiation beam that is controlled may be one or more of: a dose provided by the radiation beam; and/or a bandwidth of the radiation beam; and/or a wavelength of the radiation beam; and/or a focal property of the radiation beam; and/or an angular or spatial intensity distribution of the radiation beam.

The property of the radiation beam may be controlled by controlling one or more of: a configuration of a radiation source; and/or a configuration of an illumination system; and/or a position or configuration of a patterning device; and/or a configuration or position of a projection system; and/or a position or configuration of an optical element located, in terms of a path of the radiation beam, between a radiation source and the substrate.

Determining a change in position of the substrate may be undertaken by one or more of: determining a change in position of the substrate itself; and/or determining a change in position of a holder of the substrate; and/or determining a change in position of a positioning device of a holder of the substrate.

The lithographic error may be or comprise of, for example, an unintended increase or decrease in one or more dimensions of a pattern feature.

Using the change in position of the substrate to control a property of the radiation beam when or as the radiation beam is projected onto the substrate to reduce the lithographic error may comprise: controlling a length (i.e., a duration), intensity, shape, profile, wavelength or bandwidth of one or more pulses of radiation constituting the radiation beam.

According to a second aspect of the present invention, there is provided a lithographic apparatus. An illumination system provides a radiation beam. A patterning device imparts the radiation beam with a pattern in its cross-section; a substrate holder for holding a substrate. A projection system projects the patterned radiation beam onto a target portion of the substrate. A measurement arrangement determines a change in position of the substrate in a direction substantially parallel to a direction of propagation of the patterned radiation beam that is, or is to be, in use projected on to that substrate, which change in position would result in a lithographic error in the application of a pattern to that substrate using that patterned radiation beam; a controller configured to use the change in position of the substrate to control a property of the radiation beam when, or as, in use the radiation beam is projected onto the substrate in order to reduce the lithographic error.

The controller may be configured to control one or more of: a dose provided by the radiation beam; and/or a bandwidth of the radiation beam; and/or a focal property of the radiation beam; and/or an angular or spatial intensity distribution of the radiation beam.

The controller may be configured to control a property of the radiation by being configured to control one or more of: a configuration of a radiation source forming part of or being in connection with the lithographic apparatus; and/or a configuration of an illumination system; and/or a position or configuration of a patterning device; and/or a configuration or position of a projection system; and/or a position or configuration of an optical element located, in terms of a path of the radiation beam, between a radiation source and the substrate.

The controller may be in wired or wireless connection with any one or more elements of the lithographic apparatus, or the radiation source, to undertake such control.

The measurement arrangement may be configured to determine a change in position of the substrate by being configured to: determine a change in position of the substrate itself; and/or determine a change in position of a holder of the substrate; and/or determine a change in position of a positioning device of a holder of the substrate.

According to a third aspect of the present invention, there is provided at least a part of a device manufactured using the method or apparatus of any aspect or embodiment of this invention.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 1 schematically depicts an example of a lithographic apparatus.

Figure 2:
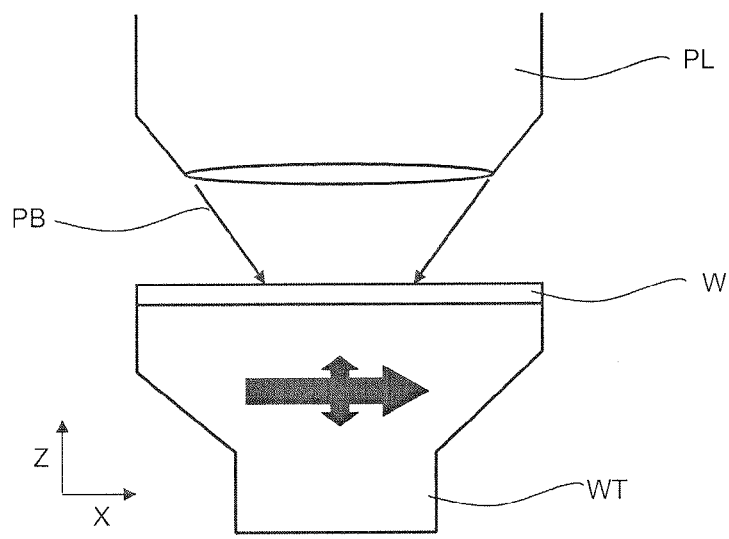

FIG. 2 schematically depicts the scanning of a substrate relative to a projection system.

Figure 3:
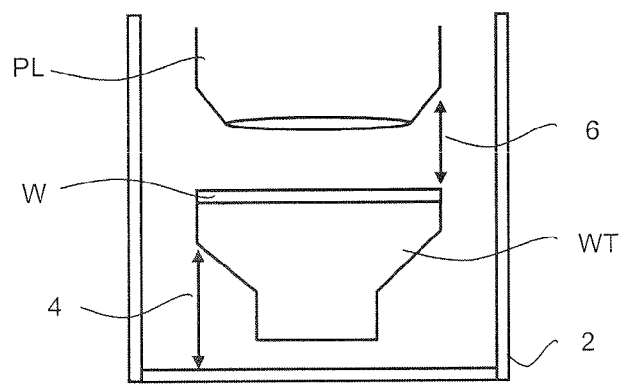

FIG. 3 schematically depicts two different ways in which a change in position of a substrate may be determined.

Figure 4:
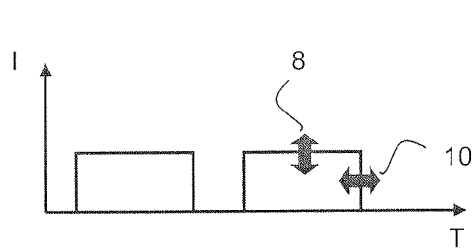

FIG. 4 schematically depicts pulses of radiation constituting a radiation beam, and the variation of a length and/or intensity of a pulse of radiation in accordance with an embodiment of the present invention.

Figure 5:
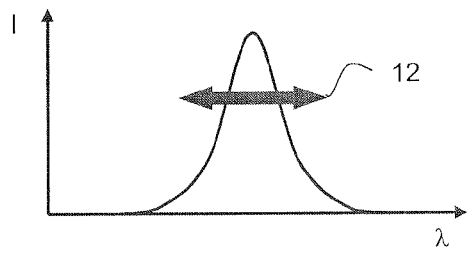

FIG. 5 schematically depicts a bandwidth of a pulse of radiation constituting a radiation beam, and variation of that bandwidth, in accordance with an embodiment of the present invention.

Figure 6:
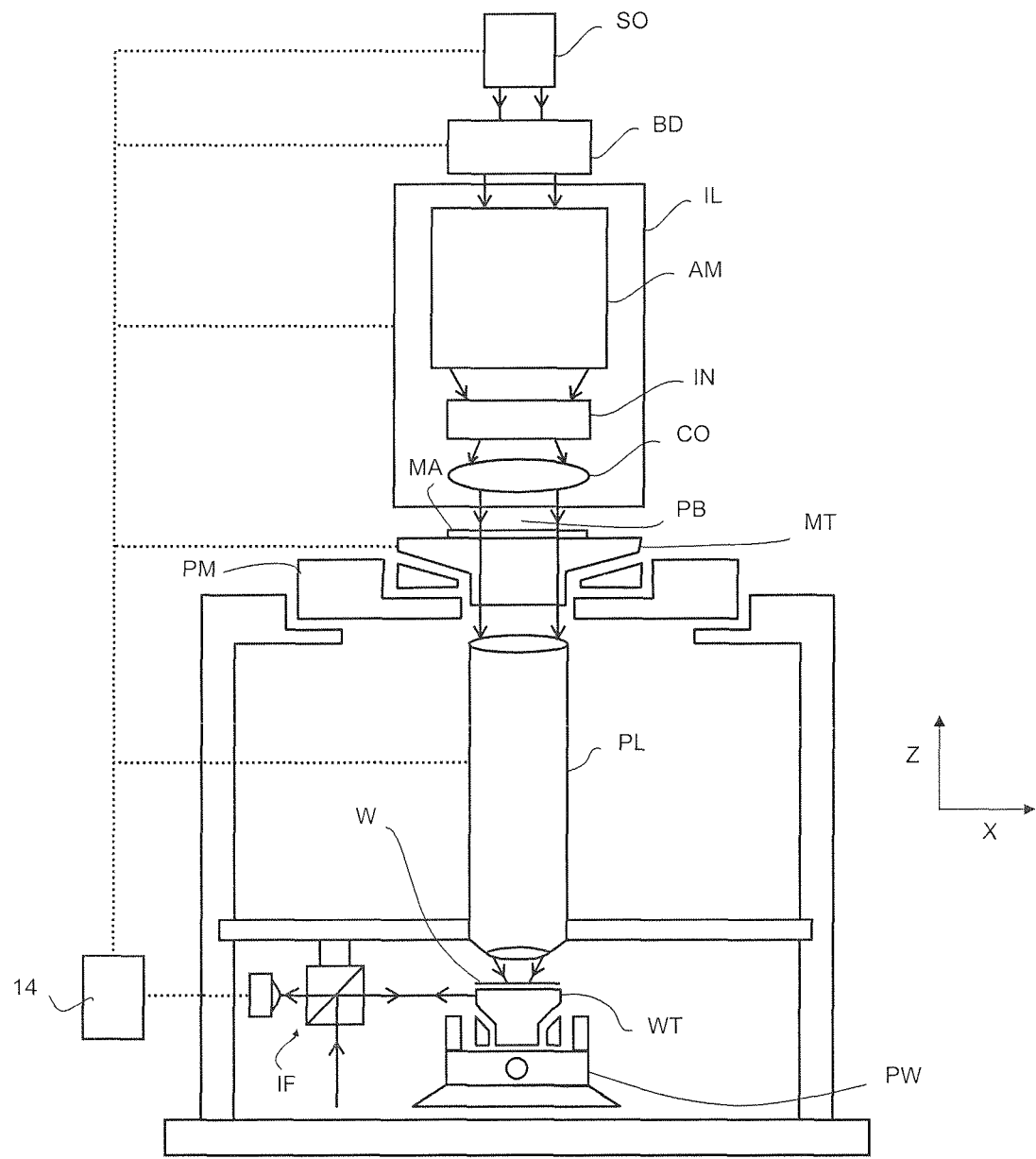

FIG. 6 schematically depicts a lithographic apparatus provided with a measurement arrangement configured to the determine a change in position of a substrate, and a controller configured to control a property of a radiation beam (by controlling a property of a component of the lithographic apparatus) in response to the determined change in position of the substrate.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of a patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate holders (and/or two or more support structures). In such "multiple stage" machines the additional holders may be used in parallel, or preparatory steps may be carried out on one or more holders while one or more other holders are being used for exposure.

The lithographic apparatus may also be of a type wherein the substrate is immersed in a liquid having a relatively high refractive index, e.g., water, so as to fill a space between the final element of the projection system and the substrate. Immersion techniques are well known in the art for increasing the numerical aperture of projection systems.

FIG. 1 schematically depicts an example of a lithographic apparatus. The apparatus comprises an illumination system (illuminator) IL to condition a beam PB of radiation (e.g., UV radiation or EUV radiation), a support structure (e.g., a mask table) MT to support a patterning device (e.g., a mask) MA and connected to first positioning device PM to accurately position the patterning device with respect to item PL, a substrate holder (e.g., a wafer table) WT for holding a substrate (e.g., a resist coated wafer) W and connected to second positioning device PW for accurately positioning the substrate with respect to item PL and a projection system (e.g., a refractive projection lens) PL configured to image a pattern imparted to the radiation beam PB by patterning device MA onto a target portion C (e.g., comprising one or more dies) of the substrate W.

As here depicted, the apparatus is of a transmissive type (e.g., employing a transmissive mask). Alternatively, the apparatus may be of a reflective type (e.g., employing a programmable minor array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander—i.e., the radiation source SO may be in connection with the lithographic apparatus. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device (e.g., mask) MA, which is held on the support structure MT. Having traversed the patterning device MA, the beam PB passes through the projection system PL, which focuses the beam onto a target portion C of the substrate W. With the aid of the second positioning device PW and position sensor IF (e.g., an interferometric device), the substrate holder WT can be moved accurately, e.g., so as to position different target portions C in the path of the beam PB. Similarly, the first positioning device PM and another position sensor (which is not explicitly depicted in FIG. 1) can be used to accurately position the patterning device MA with respect to the path of the beam PB, e.g., after mechanical retrieval from a mask library, or during a scan. In general, movement of the object tables/holders MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate holder WT are kept essentially stationary, while an entire pattern imparted to the beam PB is projected onto a target portion C in one go (i.e., a single static exposure). The substrate holder WT is then shifted in the X and/or Y direction so that a different target portion C can be exposed. In step mode, the maximum size of the exposure field limits the size of the target portion C imaged in a single static exposure.

2. In scan mode, the support structure MT and the substrate holder WT are scanned synchronously while a pattern imparted to the beam PB is projected onto a target portion C (i.e., a single dynamic exposure). The velocity and direction of the substrate holder WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate holder WT is moved or scanned while a pattern imparted to the beam PB is projected onto a target portion C. In this mode, generally a pulsed radiation source is employed and the programmable patterning device is updated as required after each movement of the substrate holder WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIG. 2 schematically depicts a part of the lithographic apparatus of FIG. 1 when operating in scan mode, as discussed above. Specifically, FIG. 2 depicts the projection system PL projecting the radiation beam PB onto the substrate W. The substrate W is held by the substrate table WT.

During a scan of the substrate, the substrate table WT is moved in order to scan the substrate table WT and the substrate held on that substrate table WT relative to the projection system PL. The substrate table WT may be moved by a positioning device (not shown). The radiation beam PB is, in general, projected onto the substrate W along a Z-axis (i.e., substantially perpendicular to a surface of the substrate). The substrate table WT and therefore substrate W are scanned in a direction substantially orthogonal to the direction of projection (or propagation) of the radiation beam PB. In this example, this means that the substrate table WT and substrate W are scanned in the X-direction. A large black arrow indicates the direction of movement and scanning of the substrate table WT and the substrate W. Smaller black arrows depict a change in position of the substrate table WT and therefore substrate W in a direction substantially parallel to the direction of projection (or propagation) of the radiation beam PB. In this example, the change in position of the substrate is in the Z-direction.

Changes in position of the substrate W during scanning may result in a lithographic error in the application of a pattern to the substrate W using the radiation beam PB. For instance, movement of the substrate W toward or away from the projection system PL may result in the radiation beam PB not being focused as desired or as intended on the substrate which may, for example, result in a lack of contrast of an image projected onto the substrate in order to apply patterns to that substrate. In general, the lithographic error may comprise of an unintended increase or decrease in one or more dimensions of a pattern feature applied to the substrate. The unintended increase or decrease in the one or more dimensions of the pattern feature may be or comprise of an unintended increase or decrease in a width, a height, a side wall angle, an overall shape, or the like, of the pattern feature.

It is desirable to reduce or eliminate lithographic errors to attempt to ensure that pattern features are applied as intended to the substrate. In the case of embodiments of the present invention, a lithographic error may arise due to a change in position of a substrate in a direction substantially parallel to a direction of projection or propagation of a beam of radiation that is, or is to be, incident on that substrate. It is desirable to be able to take into account and/or at least partially compensate for the change in position of the substrate, so that the lithographic errors that would otherwise result from the change in position are reduced or eliminated.

According to an embodiment of the present invention there is provided a lithographic method which comprises determining a change in position of a substrate in a direction substantially parallel to a direction or propagation (or projection) of a radiation beam that is, or to be, projected onto that substrate, which change in position would (e.g., otherwise) result in a lithographic error in the application of a pattern to that substrate using that radiation beam. The change in position of the substrate is then used to control a property of the radiation beam when, or as, the radiation beam is projected onto the substrate in order to reduce or eliminate the lithographic error. A feedback loop is thus provided, in which information relating to the change in position of the substrate, for example toward or away from the projection system (in terms of the path the radiation beam takes through the lithographic apparatus) is fed to a controller or the like to control one or more properties of the radiation beam. The property may be controlled by appropriate control of one or more elements of the lithographic apparatus, or radiation source in connection with that apparatus, to take into account and/or at least partially compensate for a change in position of the substrate, thus reducing or eliminating the lithographic error that would otherwise result. The change in the property of the radiation beam thus tracks a change in position of the substrate.

The change in position of the substrate may be determined as the substrate is scanned substantially orthogonal to the direction or propagation or projection of the radiation beam. Embodiments of the invention are also applicable to situations in which the substrate is not scanned. However, the problems described above may be more prevalent during the scanning of the substrate, since movement of the substrate during the scan may result in an increase in the likelihood of movement in the direction substantially parallel to the direction or propagation of the radiation beam. For this reason, the property of the radiation beam may be controlled as the substrate is scanned.

The change in position of the substrate may be determined related to a substantially fixed reference, for example a metrology frame or housing of the lithographic apparatus. In this manner, a substantially absolute determination of the change in position of the substrate may be determined. In some examples, however, an absolute measurement may not be required, or be necessary, or be advantageous. It may be more desirable or advantageous to determine a relative change in position of the substrate, for example relative to an element of a lithographic apparatus that is to be used to control a property of the radiation beam, and/or to project the radiation beam onto the substrate. This is because the relative change in position of the substrate and the particular element of the lithographic apparatus may determine the likelihood of the occurrence of a lithographic error, or the magnitude of the error. For example, if the projection system and the substrate both move during a scan, but the movement is synchronized and in phase so that there is no relative movement in the direction or propagation or projection of the radiation beam, then there may be little or no lithographic error.

FIG. 3 schematically depicts the same parts of the lithographic apparatus shown in and described with reference to FIG. 2. Referring to FIG. 3, a metrology frame 2 is also shown. The Figure schematically depicts the principle that the determination of a change of position of the substrate W in a direction substantially parallel to a direction or propagation or projection of a radiation beam may be undertaken in one of a number of ways. In a first example, a substantially absolute change in position 4 may be determined by determining the change in position of the substrate W relative to the metrology frame 2. In another example, a relative change in position of the substrate W to, in this example, the projection system PL may be determined. In some embodiments, the projection system PL may be attached to metrology frame 2. This attachment may be important in the performance of the projection system PL, and may thus be non-rigid, allowing a position deviation of the projection system PL with respect to metrology frame 2.

The determination of the position, or change in position, of the substrate W may be undertaken by any one or more of: the determination of a change of position of the substrate W itself, and/or the determination of a change of position of a holder WT of the substrate W, and/or the determination of a change in position of a positioning device (not shown) of the substrate holder WT. The change in position of the substrate may be determined in any one of a number of ways, for example using one or more encoders, optical encoders, interferometric systems, or the like. A relative change in position of the substrate may be determined by using the substrate W (or substrate holder WT or positioning device) as a reference, and then measuring the change in position of an element of the lithographic apparatus relative to the substrate W (or substrate holder WT or positioning device).

As and when the change in position of the substrate is determined, information detailing the change in position can be fed back to a controller of one or more elements of the lithographic apparatus. The controller can control one or more properties of the radiation beam in order to at least partially compensate for the change in position of the substrate, and thus reduce the lithographic error which would otherwise result. For example, if the determination of the change in position of the substrate reveals that the substrate has moved away from the projection system, a dose provided by the radiation beam (e.g., pulses thereof) may be increased, or the bandwidth of the radiation beam increased, or the wavelength of the radiation beam changed, or a focal property of the radiation beam (e.g., a focal position, plane, point, or depth) may be moved. In general, the property of the radiation beam that is or may be controlled may be one or more of a dose provided by the radiation beam, a bandwidth of the radiation beam, the wavelength of the radiation beam, a focal property of the radiation beam, or an angular or spatial intensity distribution of the radiation beam. The property of the radiation beam may be controlled by controlling one or more of a configuration of a radiation source (e.g., a bandwidth, intensity or pulse duration of radiation provided by that source), or a configuration of an illumination system (e.g., a position or orientation of reflective or refractive elements of that system), or a position or configuration of a patterning device (e.g., a position or orientation of reflective or refractive elements of that device), or a configuration or position of a projection system (e.g., a position or orientation of reflective or refractive elements of that system), or, in general, a position or configuration of any one or more optical elements located, in a path of the radiation beam, between a radiation source and the substrate. For instance, the optical element may be or comprise one or more reflective or refractive optical elements that may be controlled (e.g., tuned) to control a desired property of the radiation beam.

FIG. 4 is a graph schematically depicting an intensity versus time characteristic of pulses constituting a radiation beam. The dose provided by one or more pulses of the radiation beam may be controlled by, for example, controlling the pulse intensity 8 or the pulse length 10 (i.e., pulse duration). FIG. 5 shows that, alternatively or additionally, the bandwidth 12 of one or more pulses of radiation constituting the radiation beam may be controlled. Such control may be achieved by appropriate control of a radiation source that provides the pulses of radiation, as is known in the art.

An increase in the bandwidth of the radiation beam (or pulses thereof) may result in an increased depth of focus for the radiation beam. The wavelength of the radiation beam (i.e., the position of the peak of the graph in FIG. 5) has an affect on the focal position of the radiation beam. The depth of focus may be reduced by appropriate tuning of the bandwidth. The position of the depth of focus in the z-direction may be changed by changing (e.g., controlling or tuning) the wavelength of the radiation beam. In one example, the bandwidth may be set at a first level, which is a nominal default level, and the bandwidth then decreased or the peak wave length shifted to take into account a change in position of the substrate. The initial increased bandwidth may result in a slight sacrifice in, for example, a nominal contrast of pattern features on the substrate, but the overall and subsequent control of the bandwidth may result in an overall reduction in lithographic errors.

According to another, but related embodiment of the present invention, there is provided a lithographic apparatus. The apparatus comprises an illumination system for providing a radiation beam, and a patterning device for imparting the radiation beam with a pattern in its cross-section. A substrate holder is also provided for holding a substrate. A projection system for projecting the (patterned) radiation beam onto a portion of the substrate is further provided. The apparatus further comprises a measurement arrangement configured to determine (e.g., measure) a change in position of the substrate in a direction substantially parallel to a direction or propagation of the pattern radiation beam that is, or is to be, in use projected onto that substrate, which change in position would result in a lithographic error in the application of a pattern to that substrate using that (patterned) radiation beam. Furthermore, a controller is provided which is configured to use the change in position of the substrate to control a property of the radiation beam when, or as, in use the radiation beam is projected onto the substrate in order to reduce a lithographic error that might otherwise result without such control. The apparatus has all of the advantages of the method described above, and in use may implement that method.

FIG. 6 schematically depicts the lithographic apparatus of FIG. 1. In addition to the apparatus shown in FIG. 1, FIG. 6 also schematically depicts a controller 14. The controller 14 may be a computational device or the like. The controller 14 is in connection with (e.g., by a wired or wireless connection) a measurement arrangement configured to determine a change in position of the substrate in a direction substantially parallel to a direction or propagation (or projection) of a patterned radiation beam that is, or is to be, in use projected onto the substrate W. In this embodiment, the measurement arrangement is the interferometer arrangement IF, but can in other embodiments be any suitable form of measurement arrangement that is able to determine the change in position of a substrate as described. The controller 14 is also in connection (via a wired or wireless connection) with one or more different elements that constitute the lithographic apparatus. For instance, the controller 14 may be in connection with the radiation source SO, the beam delivery system BD, the illumination system IL, the patterning device MA, the support structure for the patterning device MT, or the projection system PL. The controller may control the position or configuration of any one or more of these elements of the lithographic apparatus to control a property of the radiation beam. Control of the property of the radiation beam is undertaken in response to a change in position of the substrate that would otherwise result in a lithographic error in the application of a pattern to the substrate. Such control reduces this lithographic error.

The changes in position of the substrate may occur at certain frequencies, but not others. For example, perturbations above a certain frequency (e.g., 200 Hz) may not be able to move the mass of the projection system or the substrate (or holder or positioning device) to an extent that would introduce a significant lithographic error. Perturbations below a certain frequency (e.g., 100 Hz) may be at least partially compensated for my corrective mechanisms in a positioner or holder of the substrate or projection system (or components of the projection system). Embodiments of the present invention may thus be particular applicable to changes in position of the substrate that occur at a frequency of between 100 Hz and 200 Hz.

A summary of an embodiment of the invention could be described as follows. A change in position of the substrate in a direction substantially parallel to a direction of propagation of a radiation beam that is, or is to be, projected on to that substrate (i.e., in the z-direction) may result in a defocus of the substrate. This defocus may cause, for example contrast loss, which has an affect on critical dimension uniformity of pattern features applied to the substrate (e.g., linewidth either increases or decreases). Changes in properties of a radiation beam (e.g., dose, wavelength, bandwidth) may also have an affect on critical dimension uniformity of pattern features applied to the substrate. If a relationship between defocus of the substrate and the consequent effect on critical dimension uniformity is known, together with a relationship between a change in a beam property and the consequent effect on critical dimension uniformity, a change in a beam property can be used to counteract (e.g., reduce the lithographic error that would otherwise result from) the change in focus. The relationships can be established from modeling, experimentation, or the like.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A lithographic method comprising:
   determining a change in position of a substrate in a direction substantially parallel to a direction of propagation of a radiation beam that is, or is to be, projected on to the substrate, wherein the change in position would result in a lithographic error in an application of a pattern to the substrate using the radiation beam; and
   controlling a configuration of a radiation source based on the change in position of the substrate in order to control a property of the radiation beam, when or as the radiation beam is projected onto the substrate in order to reduce the lithographic error, wherein:

the property of the radiation beam is controlled as the substrate is scanned, and the property of the radiation beam that is controlled is one or more of:
- a bandwidth of the radiation beam;
- a focal property of the radiation beam;
- a wavelength of the radiation beam; and
- an angular or spatial intensity distribution of the radiation beam.

2. The lithographic method of claim 1, wherein the change in position of the substrate is determined as the substrate is scanned in a direction substantially orthogonal to the direction of propagation of the radiation beam.

3. The lithographic method of claim 1, wherein the change in position of the substrate is determined relative to a substantially fixed reference.

4. The lithographic method of claim 1, wherein the change in position of the substrate is determined relative to an element of a lithographic apparatus that is to be used to control the property of the radiation beam or to project the radiation beam onto the substrate.

5. The lithographic method of claim 1, further comprising, in order to control the property of the radiation beam, controlling one or more of:
- a configuration of an illumination system;
- a position or configuration of a patterning device;
- a configuration or position of a projection system; and
- a position or configuration of an optical element located, in terms of a path of the radiation beam, between the radiation source and the substrate.

6. The lithographic method of claim 1, wherein determining a change in position of the substrate is undertaken by one or more of:
- determining a change in position of the substrate itself;
- determining a change in position of a holder of the substrate; and
- determining a change in position of a positioning device of the holder of the substrate.

7. The lithographic method of claim 1, wherein the lithographic error comprises of an unintended increase or decrease in a dimension of a pattern feature.

8. A lithographic apparatus comprising:
an illumination system configured to provide a radiation beam;
a patterning device configured to impart the radiation beam with a pattern in its cross-section;
a substrate holder configured to hold a substrate;
a projection system configured to project the patterned radiation beam onto a target portion of the substrate,
a measurement arrangement configured to determine a change in position of the substrate in a direction substantially parallel to a direction of propagation of the patterned radiation beam that is, or is to be, projected on to the substrate, wherein the change in position would result in a lithographic error in an application of a pattern to the substrate using the patterned radiation beam; and
a controller configured to control a configuration of a radiation source based on the change in position of the substrate in order to control a property of the radiation beam, when or as the radiation beam is projected onto the substrate in order to reduce the lithographic error, wherein:
the property of the radiation beam is controlled as the substrate is scanned, and
the property of the radiation beam is one or more of:
- a bandwidth of the radiation beam;
- a wavelength of the radiation beam;
- a focal property of the radiation beam; and
- an angular or spatial intensity distribution of the radiation beam.

9. The lithographic apparatus of claim 8, wherein the controller is further configured to control one or more of:
- a configuration of an illumination system;
- a position or configuration of a patterning device;
- a configuration or position of a projection system; and
- a position or configuration of an optical element located, in terms of a path of the radiation beam, between the radiation source and the substrate.

10. The lithographic apparatus of claim 8, wherein the measurement arrangement is configured to determine one or more of:
- a change in position of the substrate itself;
- a change in position of a holder of the substrate; and
- a change in position of a positioning device of the holder of the substrate.

* * * * *